United States Patent
Nakajima

(10) Patent No.: US 8,901,967 B2
(45) Date of Patent: Dec. 2, 2014

(54) COMPARATOR

(71) Applicant: Fuji Electric Co., Ltd., Kawasaki-shi (JP)

(72) Inventor: Hiroyuki Nakajima, Nagano (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/079,208

(22) Filed: Nov. 13, 2013

(65) Prior Publication Data

US 2014/0152346 A1 Jun. 5, 2014

(30) Foreign Application Priority Data

Dec. 3, 2012 (JP) ................... 2012-264808

(51) Int. Cl.
*H03K 5/22* (2006.01)
*H03K 5/24* (2006.01)

(52) U.S. Cl.
CPC .................... *H03K 5/2481* (2013.01)
USPC .......................................... 327/77

(58) Field of Classification Search
CPC ........... H02M 1/32; H02H 3/20; H02H 3/202; H02H 3/22
USPC ........................................ 327/77, 85, 87–89
See application file for complete search history.

(56) References Cited

U.S. PATENT DOCUMENTS

| | | | | |
|---|---|---|---|---|
| 3,489,919 A | * | 1/1970 | Wolterman | 361/86 |
| 5,198,957 A | * | 3/1993 | Welty et al. | 361/18 |
| 5,650,906 A | * | 7/1997 | Marquardt et al. | 361/88 |
| 6,118,308 A | * | 9/2000 | Sander | 327/66 |
| 6,483,683 B1 | * | 11/2002 | Stenstrom | 361/91.1 |
| 8,164,364 B2 | * | 4/2012 | Doorenbos et al. | 327/65 |

FOREIGN PATENT DOCUMENTS

JP S55-104766 A 8/1980

* cited by examiner

*Primary Examiner* — William Hernandez
(74) *Attorney, Agent, or Firm* — Rabin & Berdo, P.C.

(57) ABSTRACT

A comparator comprises a differential amplifier type including input MOSFETs receiving differential input of a reference voltage and an input voltage, load MOSFETs for the input MOSFETs, and a constant current source to supply the sources of the input MOSFETs. The comparator comprises a Zener diode that is connected between the gate and source of the input MOSFETs and exhibits a breakdown voltage lower than the withstand voltage of the gate oxide film of the input MOSFET. Another comparator further comprises a feedback MOSFET that performs negative feedback of an output voltage of a main body comparator to the gates of the load MOSFETs to restrict the amplitude of the output voltage. Still another comparator further comprises a semiconductor rectifying element that exhibits a reverse-blocking characteristic higher than the power supply voltage and is interposed between the constant current source and the source of each of the input MOSFETs.

18 Claims, 9 Drawing Sheets

US 8,901,967 B2

COMPARATOR

CROSS-REFERENCE TO RELATED APPLICATION

This application is based on, and claims priority to, Japanese Patent Application No. 2012-264808, filed on Dec. 3, 2012, contents of which are incorporated herein by reference.

BACKGROUND OF THE INVENTION

1. Field of the Invention

The present invention relates to a comparator of a differential amplifier type with a CMOS structure, and in particular, to a comparator that performs a protection function for a gate oxide film of an input MOS-FET.

2. Description of the Related Art

Widely used comparators compare a reference voltage Vref and an input voltage Vin and deliver an output voltage Vout corresponding to the relative magnitude. FIG. 8 shows a schematic construction of a conventionally common comparator of a differential amplifier type having a CMOS structure. This comparator is basically composed of a main body comparator 10 of a differential amplifier type and an inverter circuit 20 that inverts the output voltage of the main body comparator 10 and outputs the voltage.

The main body comparator 10 comprises a differential pair of input MOSFETs 11 and 12 of a p channel type that receive a reference voltage Vref and an input voltage Vin at respective gate terminals thereof. The source of each of the MOSFETs 11 and 12 is connected to a constant current source, and the drains are connected to load MOSFETs 13 and 14 of an n channel type, which are active loads. These MOSFETs construct a differential amplifier of a CMOS structure.

The load MOSFETs 13 and 14 have the source electrodes thereof grounded and the gate electrodes connected to each other. The drain electrodes thereof are connected to the drain electrodes of the pair of input MOSFETs 11 and 12. Of the load MOSFETs 13 and 14, the load MOSFET 13 in the side of receiving the reference voltage Vref has the gate and drain terminals connected to each other to be used as a diode. The constant current source is composed of a MOSFET 15 of a p channel type to supply constant current to the source terminals of the pair of input MOSFETs 11 and 12. The MOSFET 15 has the source electrode thereof connected to a power supply V and a gate terminal thereof receiving a specified bias voltage Vbias.

The inverter circuit 20 is composed of a MOSFET 21 of a p channel type and a MOSFET 22 of an n channel type that are in cascade connection and disposed between the power supply V and the ground (GND). The inverter circuit 20 having a CMOS structure composed of the MOSFETs 21 and 22 receives the drain voltage of the input MOSFET 12, which is the output of the main body comparator 10. The MOSFETs 21 and 22 turn ON complementarily and invert the output, which is a drain voltage of the MOSFET, and deliver the voltage Vout externally.

In the comparator having the construction described above, when the input voltage Vin is lower than the reference voltage Vref, Vin<Vref, the input MOSFET 11 receiving the reference voltage Vref is in an OFF state and the input MOSFET 12 receiving the input voltage Vin is in an ON state. As a result, the drain voltage of the input MOSFET 11 becomes approximately ground potential, nearly zero volts, turning OFF the load MOSFETs 13 and 14. The drain voltage of the input MOSFET 12, which is the output of the main body comparator 10, turns to an H level. As a consequence, the MOSFET 21 of the inverter circuit 20 turns OFF and the MOSFET 22 turns ON, turning the output voltage Vout of the inverter circuit 20 to a level which is the ground potential, zero volts.

When the input voltage Vin is higher than the reference voltage Vref, Vin>Vref, the input MOSFET 11 receiving the reference voltage Vref is in an ON state and the input MOSFET 12 receiving the input voltage Vin is in an OFF state. As a result, the load MOSFETs 13 and 14 assume an ON state and the drain voltage of the input MOSFET 12, which is the output of the main body comparator 10, becomes the ground potential, nearly zero volts, through the load MOSFET 14 in an ON state. As a consequence, the MOSFET 21 of the inverter circuit 20 turns ON and the MOSFET 22 turns OFF, turning the output voltage Vout of the inverter circuit 20 to an H level, which approximately equals the power supply voltage.

Patent Document 1 (identified further on), for example, discloses in detail a comparator that has a construction similar to the one described above and performs inversion operation corresponding to an input voltage Vin.

[Patent Document 1]

Japanese Unexamined Patent Application Publication No. S55-104766

A comparator having a construction as described above has an advantage in that the input impedance thereof is high owing to the construction of the input stage consisting of the input MOS-FETs 11 and 12, on the one hand. But the comparator has a disadvantage in that the permitted range of the input voltage Vin to the comparator is restricted by the thickness of the gate oxide film in the input MOSFETs 11 and 12 on the other hand. If a MOSFET with a thin gate oxide film is subjected to a high gate-source voltage Vgs, the gate oxide film breaks down due to the strong electric field.

A generally-used gate oxide film of $SiO_2$ has a breakdown electric field strength of about $2.0 \times 10^6$ V/cm. Thus, a comparator capable of direct comparison of a high input voltage Vin can be constructed using a MOSFET having a sufficiently thick gate oxide film. A MOSFET with a thick gate oxide film, however, has difficulty in constructing a fine structure of the comparator in an integrated circuit structure. Further problems should arise of increase in the threshold voltage of the MOSFET and decrease in the switching speed.

FIG. 9 shows a simulation result of variation of gate-source voltages Vgs of the input MOSFETs 11 and 12 when the input voltage Vin is changed from zero to $V_{DD}$ in a comparator having a construction described above, wherein the power supply voltage $V_{DD}$=42 V and the reference voltage Vref=$V_{DD}$/2=21 V. In this example, the voltage between the gate and source of the input MOSFET 12 is the direct voltage difference between the gate of the input MOSFET 11 and the gate voltage of the input MOSFET 12, and rises to $\pm V_{DD}/2$=21 V at the maximum.

If the reference voltage Vref is set at a low voltage of the ground potential, zero volts, or at a high voltage near the power supply voltage $V_{DD}$, the structure between the gate and source of the input MOSFET 12 can be subjected to a high voltage near the power supply voltage $V_{DD}$ at 42 V. Thus, a thin gate oxide film of the input MOSFETs 11 and 12 may break down.

In order to avoid this problem, a conventional comparator is generally provided with series-connected shunt resistors R1 and R2 as indicated in FIG. 8 to receive the input voltage Vin' after dividing it with the resistors. The use of the shunt resistors R1 and R2, however, raises new problems of not only expansion of the circuit area for the comparator in an integrated circuit structure, but also degradation of accuracy due to the scattering of the shunt resistor ratio and malfunctioning due to degradation of the SN ratio.

SUMMARY OF THE INVENTION

The present invention has been made in view of the above-described problems and an object of the present invention is to provide a comparator with a simple construction that does not breakdown a MOSFET having a thin gate oxide film and can directly compare a high input voltage.

In order to achieve the object, a comparator of a first aspect of the present invention comprises a main body comparator including a pair of input MOSFETs in a differential pair receiving a reference voltage and an input voltage at a respective gate of the input MOSFETs, a pair of load MOSFETs having gates thereof connected to each other and drains thereof connected to respective drain of the input MOSFETs, and a constant current source to supply a constant current to sources of the input MOSFETs, and Zener diodes exhibiting a breakdown voltage lower than a withstand voltage of a gate oxide film of the input MOSFETs and connected between the gate and the source of each of the input MOSFETs in parallel in a forward direction.

A comparator of a second aspect of the present invention comprises, in addition to the Zener diodes, a feedback MOSFET that performs negative feedback of an output voltage of the main body comparator to the gates of the load MOSFETs to restrict an amplitude of the output voltage of the main body comparator.

A comparator of a third aspect of the present invention comprises, in addition to the Zener diodes and the feedback MOSFET, semiconductor rectifying elements that perform a reverse blocking characteristic higher than a power supply voltage and are interposed between the constant current source and the source of each input MOSFET.

The input MOSFETs may be p channel type MOSFETs and the load MOSFETs may be n channel type MOSFETs, and the input MOSFETs and the load MOSFETs may compose a differential amplifier circuit with a CMOS structure.

The feedback MOSFET may have a drain and a gate thereof connected to the drain of one of the input MOSFETs, and a source of the feedback MOSFET connected to the gates of the load MOSFETs. The semiconductor rectifying element may be a rectifying diode or a MOSFET in diode connection.

A comparator may further comprise an inverter circuit with a CMOS structure that inverts the output voltage of the main body comparator and outputs an inverted voltage externally. This inverter circuit may be driven at a power supply voltage different from the power supply voltage for the main body comparator.

A comparator according to the first aspect of the present invention can clamp the voltage applied between the gate and source of the differential pair of input MOSFETs by means of the Zener diodes to restrict the gate-source voltage Vgs. Consequently, the gate oxide film of the input MOSFETs is not subjected to a high voltage or high electric field strength. Therefore, the gate oxide film is reliably protected and breakdown thereof is avoided.

A comparator according to the second aspect of the invention can further limit the variation range of the drain voltage (or the output voltage) of the input MOSFET by means of negative feedback control with the feedback MOSFET. Consequently, the voltage applied between the gate and source of the input MOSFET is limited to restrict the gate-source voltage Vgs. Therefore, the gate oxide film of the input MOSFET is effectively protected together with the effect of the Zener diode.

A comparator according to the third aspect of the invention can interrupt the current from the constant current source by the semiconductor rectifying element when the source electric potential of the input MOSFET exceeds the electric potential at the current output terminal of the constant current source, thereby restricting a voltage applied between the gate and source of the input MOSFET. Therefore, the gate oxide film of the input MOSFET is more certainly protected and effectively prevented from breakdown thereof together with the protecting effects for the gate oxide film of the input MOSFET by the Zener diode and the feedback MOSFET.

Therefore, a comparator having the construction described above, even though using a MOSFET with a thin gate oxide film, can directly compare a high input voltage Vin without breakdown of the gate oxide film of the MOSFET. A comparator of the invention does not have such disadvantages as in using a thick gate oxide film and in using shunt resistors R1 and R2. In addition, the simple circuit construction of the invented comparator provides a great practical advantage.

DETAILED DESCRIPTION OF THE INVENTION

The following describes in detail comparators according to some preferred embodiments of the invention with reference to accompanying drawings.

Figure 1:
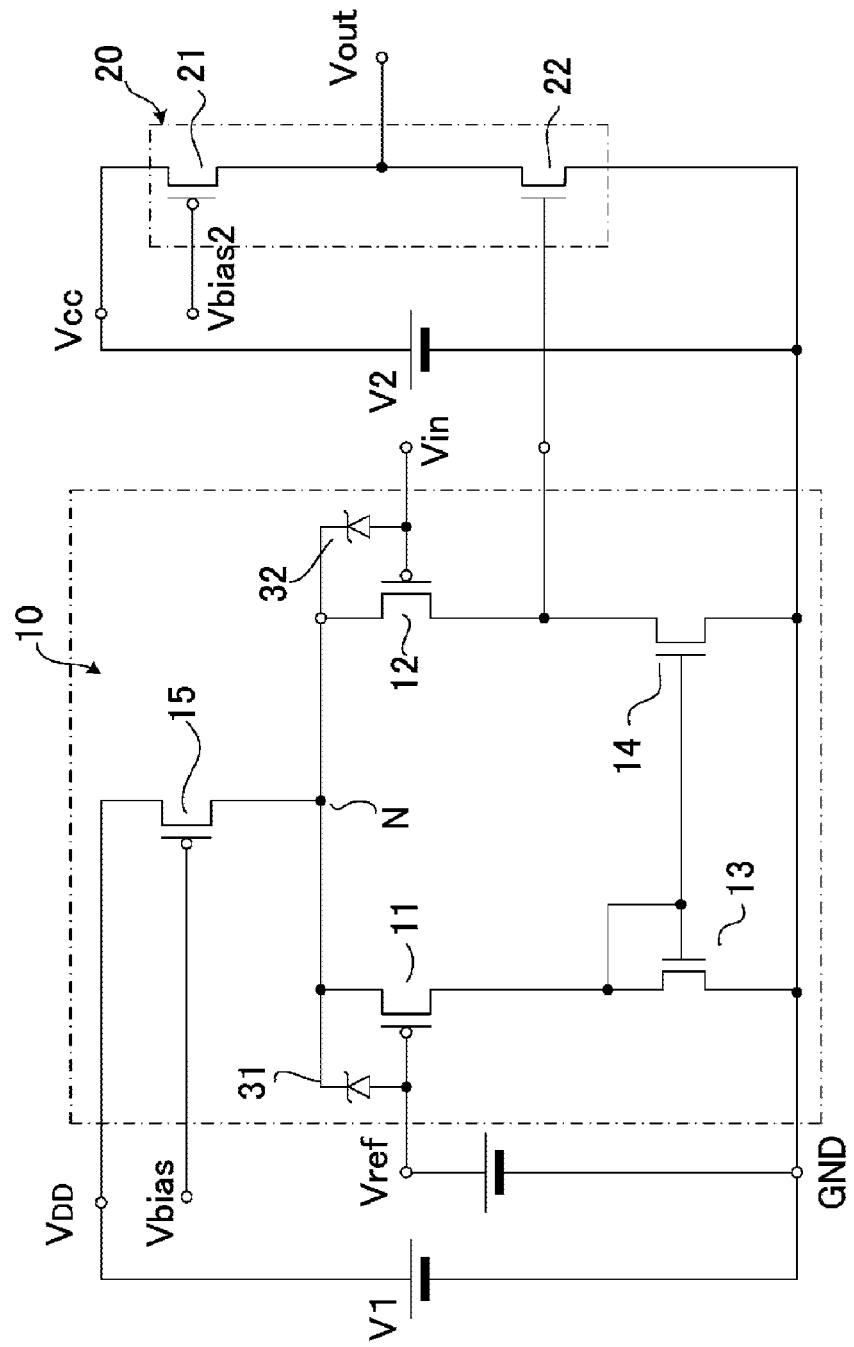
FIG. 1 shows a schematic construction of a comparator according to a first embodiment of the present invention.
Figure 8:
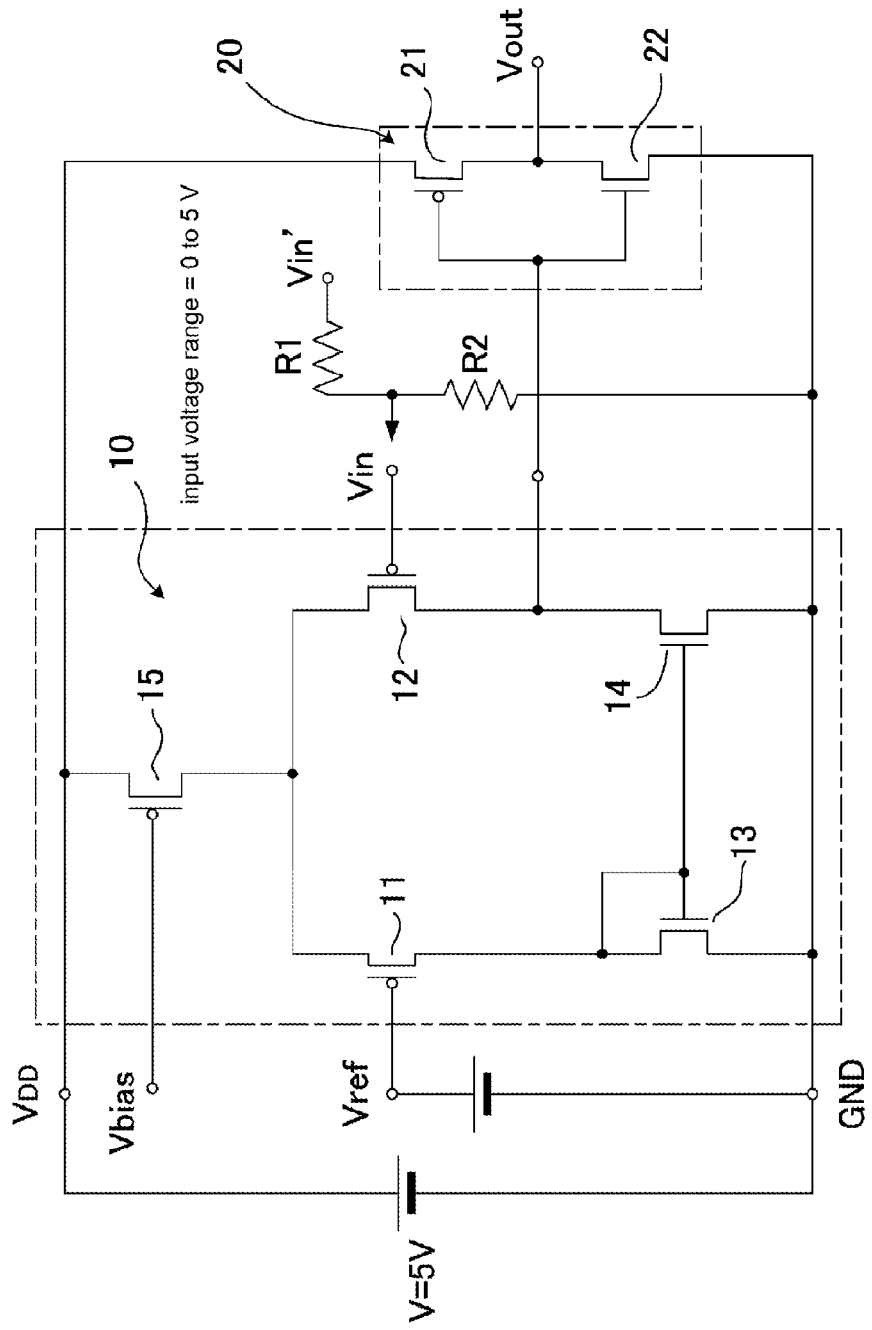
FIG. 8 shows a schematic construction of a conventional comparator having a general CMOS structure.
Figure 9:
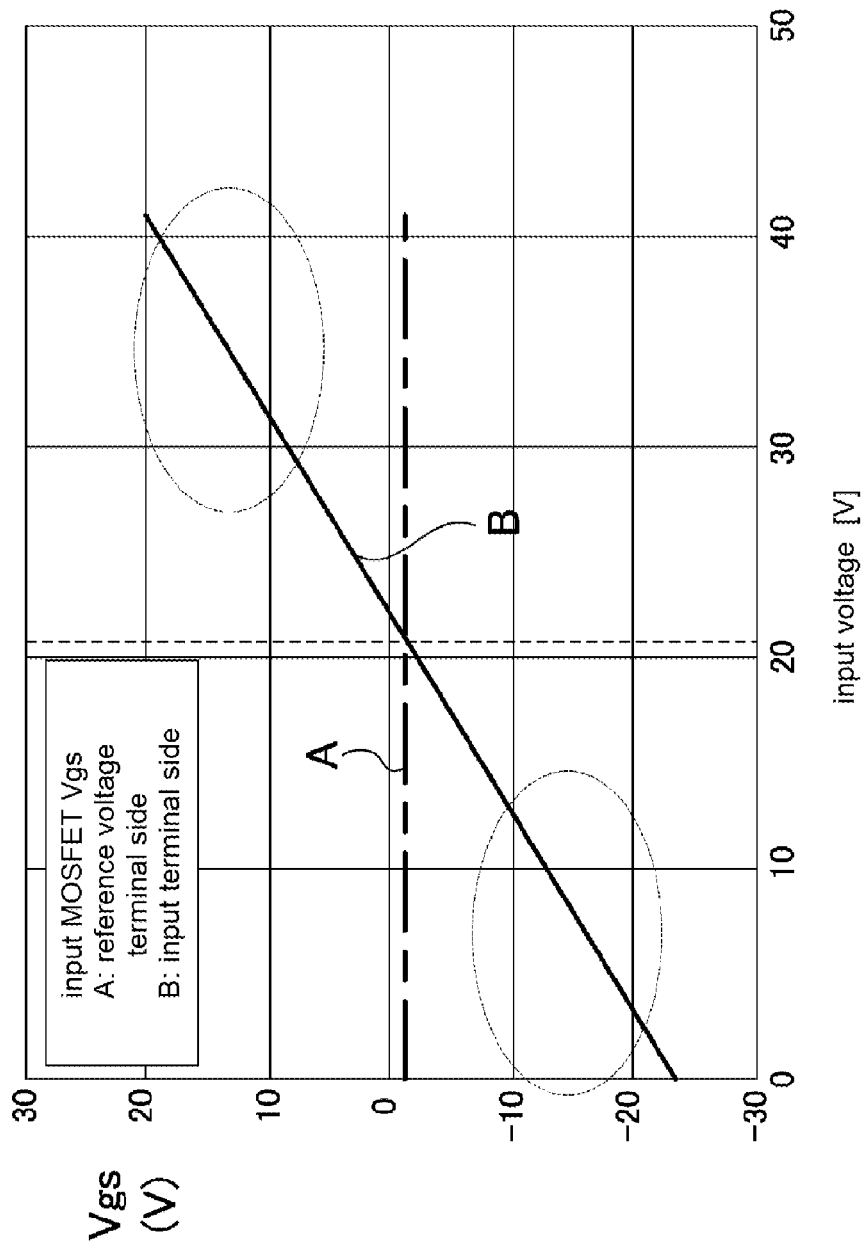
FIG. 9 shows variation of the gate-source voltage Vgs depending on the input voltage Vin to the pair of input MOSFETs in the comparator of FIG. 8.

FIG. 1 shows a schematic construction of a comparator according to a first embodiment of a first aspect of the present invention. This comparator has basically a similar construction as the conventional one shown in FIG. 8, and the same components are given the same symbols. The comparator of FIG. 1 has different power supplies V1 and V2 for driving the main body comparator 10 and the inverter circuit 20, respectively.

The power supply V1 to supply a power supply voltage $V_{DD}$ to the main body comparator 10 is a voltage source supplying 42 V, for example. The main body comparator 10 directly compares an input voltage Vin in the range of zero to 42 V with a reference voltage Vref set at $V_{DD}/2=21$ V, for example.

The power supply V2 to supply a power supply voltage $V_{CC}$ to the inverter circuit 20 is a voltage source supplying 5 V to general electronic equipment. The inverter circuit 20 having a CMOS structure is composed of a MOSFET 21 of a p channel type and a MOSFET 22 of an n channel type with the load thereof being the MOSFET 21. The MOSFET 22 receives at the gate thereof the drain voltage of the MOSFET 12, the voltage being an output of the main body comparator 10, and delivers an output voltage Vout at 0 V or 5 V, which is an inverted voltage of the output of the main body comparator 10. The MOSFET 21 receives a bias voltage Vbias2 at the gate thereof and functions as a constant current source for the MOSFET 22.

The comparator is characterized in that a Zener diode 31 is connected between the gate and source of the input MOSFET 11 of a differential pair of input MOSFETs 11 and 12 and a Zener diode 32 is connected between the gate and source of the input MOSFET 12. The Zener diodes 31 and 32 are connected between the gate and the source of the respective input MOSFETs 11 and 12 in parallel and in the forward direction. The Zener diodes 31 and 32 have a breakdown voltage lower than the withstand voltage of the gate oxide film of the input MOSFETs 11 and 12. When the gate oxide film of the input MOSFETs 11 and 12 having a gate oxide film with a thickness of 25 nm exhibits a withstand voltage of 7 V, for example, Zener diodes 31 and 32 having a breakdown voltage lower than 7 V are used.

When a comparator provided with the Zener diodes 31 and 32 is going to be subjected to a voltage higher than the withstand voltage between the gate and source of the input MOSFETs 11 and 12, the Zener diode undergoes breakdown. As a result, the voltage applied between the gate and source, a gate-source voltage Vgs, of the input MOSFETs 11 and 12 is restricted to the breakdown voltage of the Zener diodes 31 and 32. Thus, the structure between the gate and source of the input MOSFETs 11 and 12 is prevented from being subjected to a high voltage exceeding the breakdown voltage of the Zener diodes 31 and 32, which would be a high voltage over the withstand voltage of the gate oxide film. Therefore, breakdown of the gate oxide film is avoided.

Figure 2:
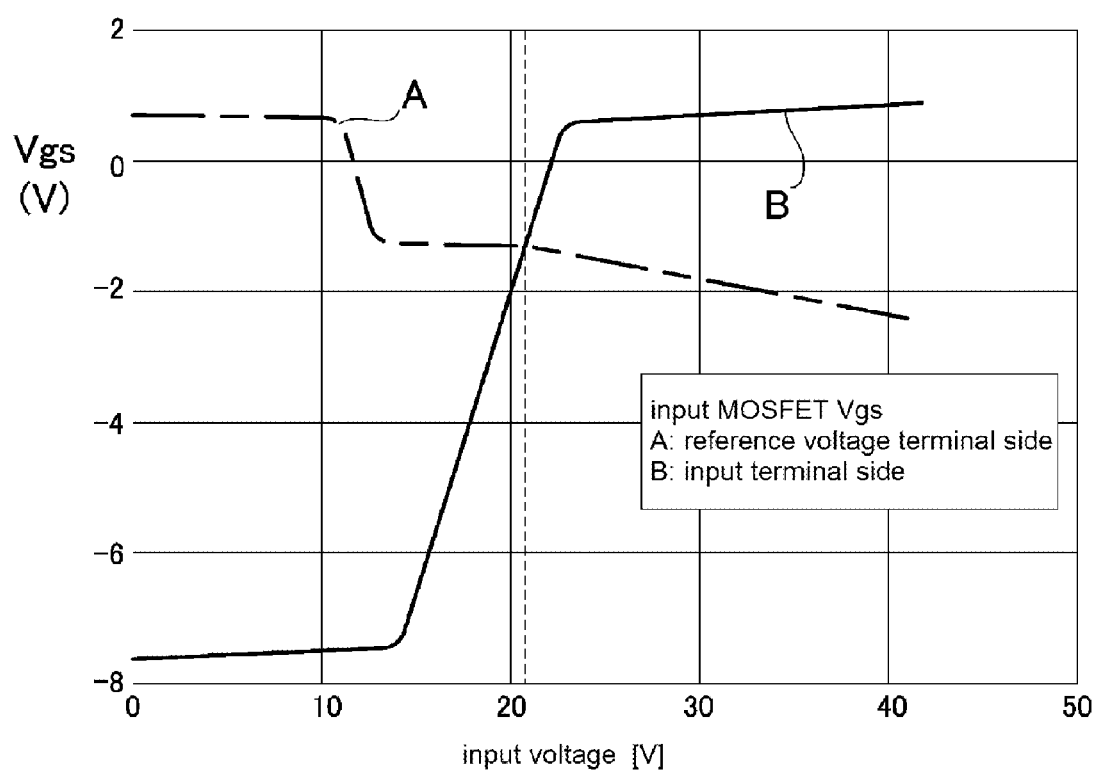
FIG. 2 shows variation of the gate-source voltage Vgs depending on the input voltage Vin to the pair of input MOSFETs in the comparator of FIG. 1.

FIG. 2 shows a simulation result of variation in the gate-source voltage Vgs of the input MOSFET 11 and the gate-source voltage Vgs of the input MOSFET 12 when the input voltage Vin is changed in the range of zero to 42 volts with a reference voltage Vref of $V_{DD}/2=21$ V. When the input voltage Vin is lower than the reference voltage Vref by more than 7 V, i.e. Vin<Vref−7, the gate-source voltage Vgs of the input MOSFET 12, which turns ON receiving the input voltage Vin, is clamped by the Zener diode 32 and held at about 7 V as shown by the characteristic curve B in FIG. 2.

As described previously, when the input voltage Vin is lower than the reference voltage Vref, Vin<Vref, the input MOSFET 11 that receives the reference voltage Vref is in an OFF state and the input MOSFET 12 that receives the input voltage Vin is in an ON state. The voltage applied between the gate and source of the input MOSFET 12 is a voltage corresponding to the difference voltage between the input voltage Vin and the reference voltage Vref.

If the input voltage Vin is lower than the reference voltage Vref by an amount larger than the breakdown voltage 7 V of the Zener diode 32 in particular, i.e. Vin<Vref−7, the voltage applied between the gate and source of the input MOSFET 12 exceeds the breakdown voltage of the Zener diode 32, to breakdown the Zener diode 32. Then the gate-source voltage Vgs of the input MOSFET 12 as shown in FIG. 2 is restricted to the breakdown voltage 7 V of the Zener diode 32. Consequently, the gate oxide film of the input MOSFET 12 is prevented from high voltage application thereon avoiding breakdown of the gate oxide film. The input MOSFET 11, which is in an OFF state, is subjected only to the forward voltage drop of the Zener diode 31 between the gate and source of the MOSFET 11 as shown in the characteristic curve A in FIG. 2.

On the other hand, when the input voltage Vin is higher than the reference voltage Vref, i.e. Vin>Vref, the input MOSFET 11 receiving the reference voltage Vref is in an ON state and the input MOSFET 12 receiving the input voltage Vin is in an OFF state as described previously. The input MOSFET 12 is subjected only to the forward voltage drop of the Zener diode 32 between the gate and source of the MOSFET 12. Between the gate and source of the input MOSFET 11, a voltage is solely applied that corresponds to a current through the input MOSFET 11 caused by biasing with the reference voltage Vref. Thus, a gate-source voltage Vgs exceeding the withstand voltage of the input MOSFET is not applied between the gate and source of the input MOSFET 11. Therefore, the gate oxide film of the input MOSFET 11 is also prevented from breakdown.

The simulation described above is conducted in the case of the reference voltage Vref of $V_{DD}/2=21$ V. However, if the reference voltage Vref is set at a low voltage near the ground potential of zero volts or at a high voltage near the power supply voltage $V_{DD}$, a higher voltage could be applied between the gate and source of the input MOSFETs 11 and 12 with variation of the input voltage Vin. Even in this case, the gate-source voltage Vgs applied between the gate and source of the input MOSFETs 11 and 12 is restricted by the Zener diodes 31 and 32. Therefore, the gate oxide film of the input MOSFETs 11 and 12 is prevented from breakdown.

Figure 3:
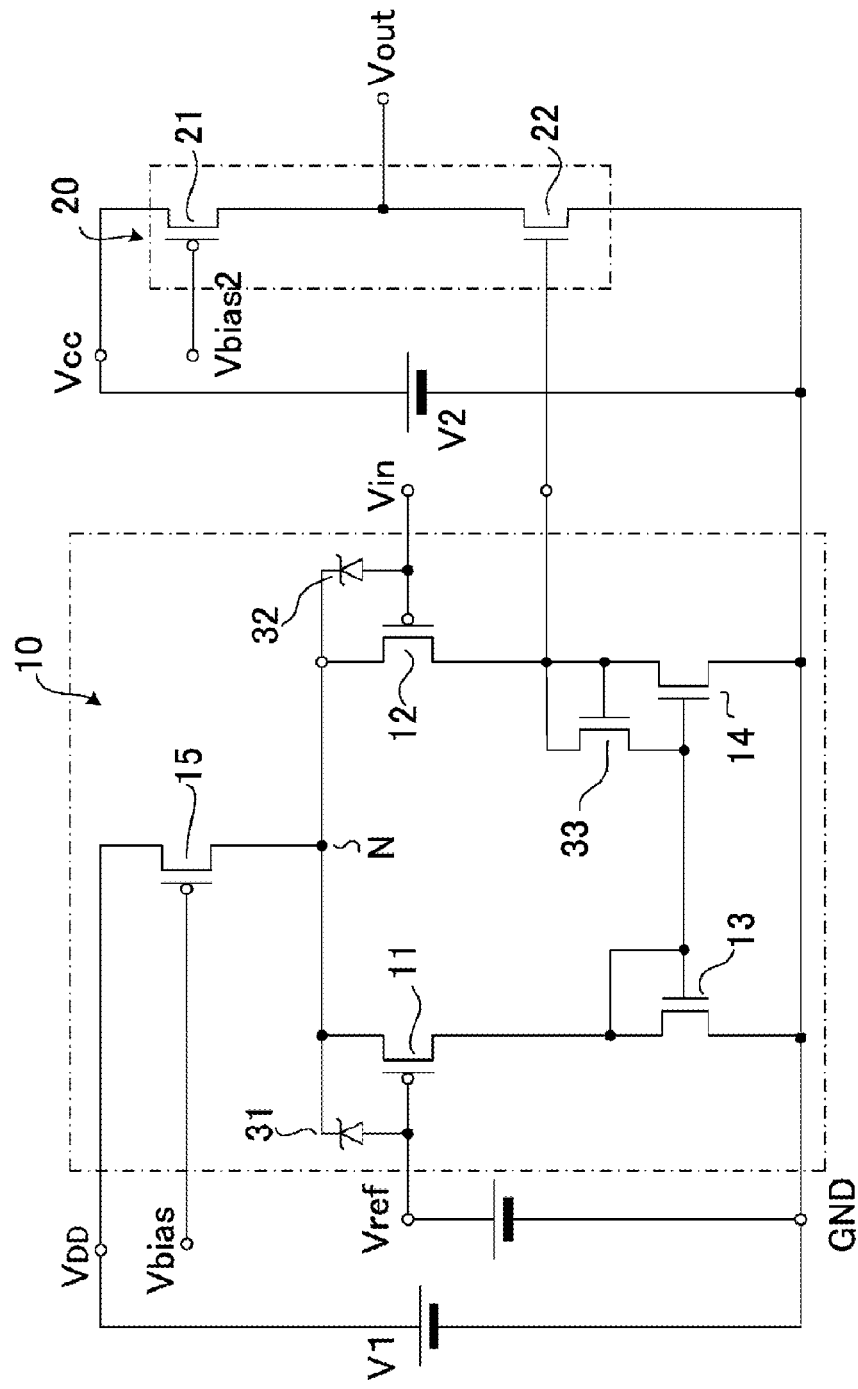
FIG. 3 shows a schematic construction of a comparator according to a second embodiment of the present invention.

A comparator can also be constructed as shown in FIG. 3, which illustrates an embodiment of the second aspect of the present invention.

This comparator is characterized by providing, in addition to the Zener diodes 31 and 32, a feedback MOSFET 33 that performs negative feedback of the output voltage of the main body comparator 10, which is the drain voltage of the input MOSFET 12, to the gate terminals of the pair of load MOSFETs 13 and 14 to limit the amplitude of the output voltage. This feedback MOSFET 33 is an n channel type MOSFET having the gate and the drain thereof connected to the drain of the input MOSFET 12 and having the source thereof connected to the gate of the load MOSFET 14.

Figure 4:
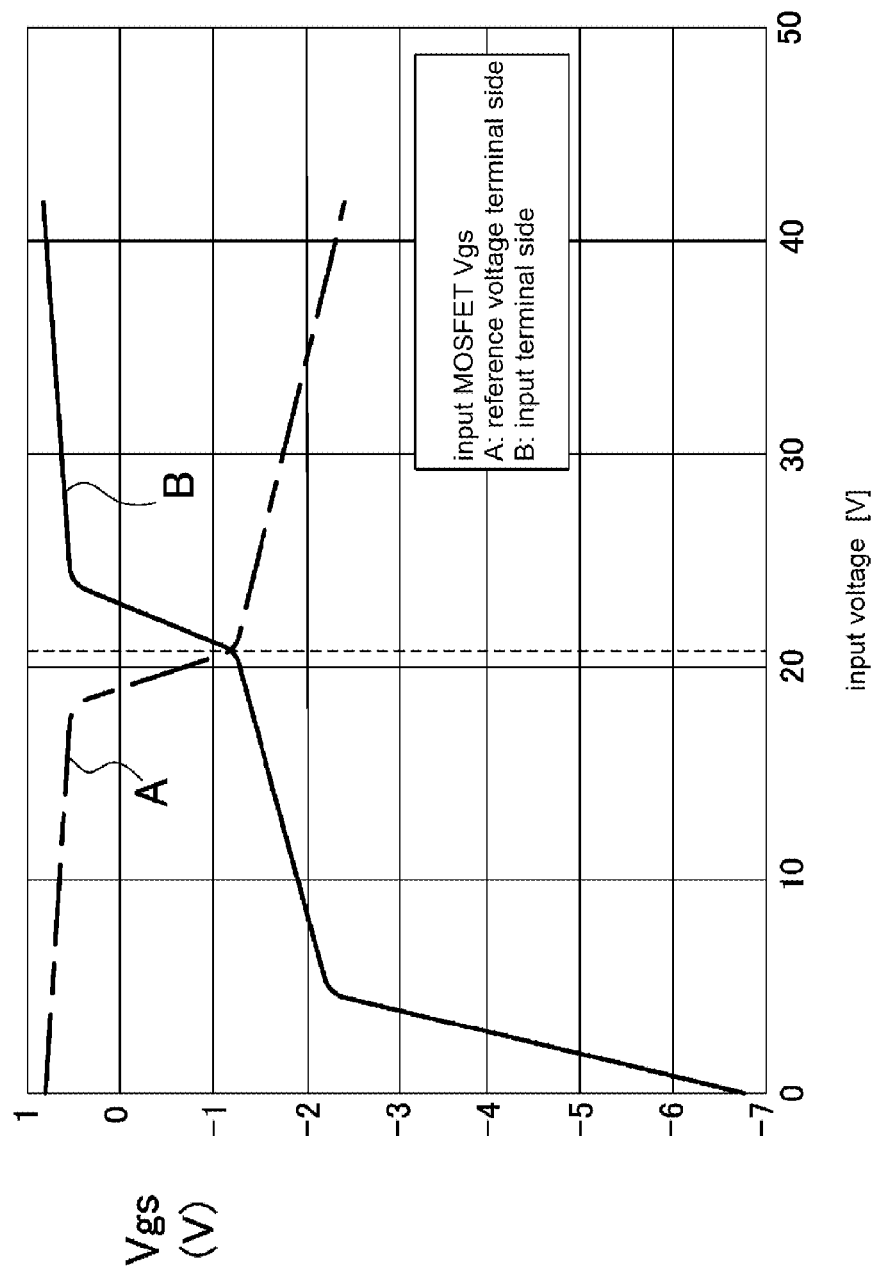
FIG. 4 shows variation of the gate-source voltage Vgs depending on the input voltage Vin to the pair of input MOSFETs in the comparator of FIG. 3.

In a comparator comprising the feedback MOSFET 33, the current flowing through the load MOSFET 14 is restricted according to the drain voltage of the input MOSFET 12. The current control by the negative feedback restricts the voltage applied between the gate and source of the input MOSFET 12. FIG. 4 shows a simulation result for the gate-source voltage Vgs of the input MOSFETs 11 and 12. As can be seen in FIG. 4, the gate-source voltage Vgs of the input MOSFETs 11 and 12 is limited to the withstand voltage of the MOSFETs.

Thus, the gate-source voltage Vgs of the input MOSFETs 11 and 12 is further limited, under the clamping function of the Zener diodes 31 and 32, by the negative feedback control by the feedback MOSFET 33. Therefore, the comparator of FIG. 3 prevents the gate oxide film of the input MOSFETs 11 and 12 from breakdown more effectively and certainly than the comparator of FIG. 1.

In addition, the negative feedback control by the feedback MOSFET 33 limits the drain voltage of the input MOSFET 12 thereby restricting the amplitude of the output voltage of the main body comparator 10. As a consequence, the amplitude of the voltage applied on the gate of the MOSFET 22 of the inverter circuit 20 is limited. Therefore, the gate of the MOSFET 32 is not subjected to an overvoltage, and the gate-source voltage Vgs of the MOSFET 22 is restricted preventing the gate oxide film thereof from breakdown.

Figure 5:
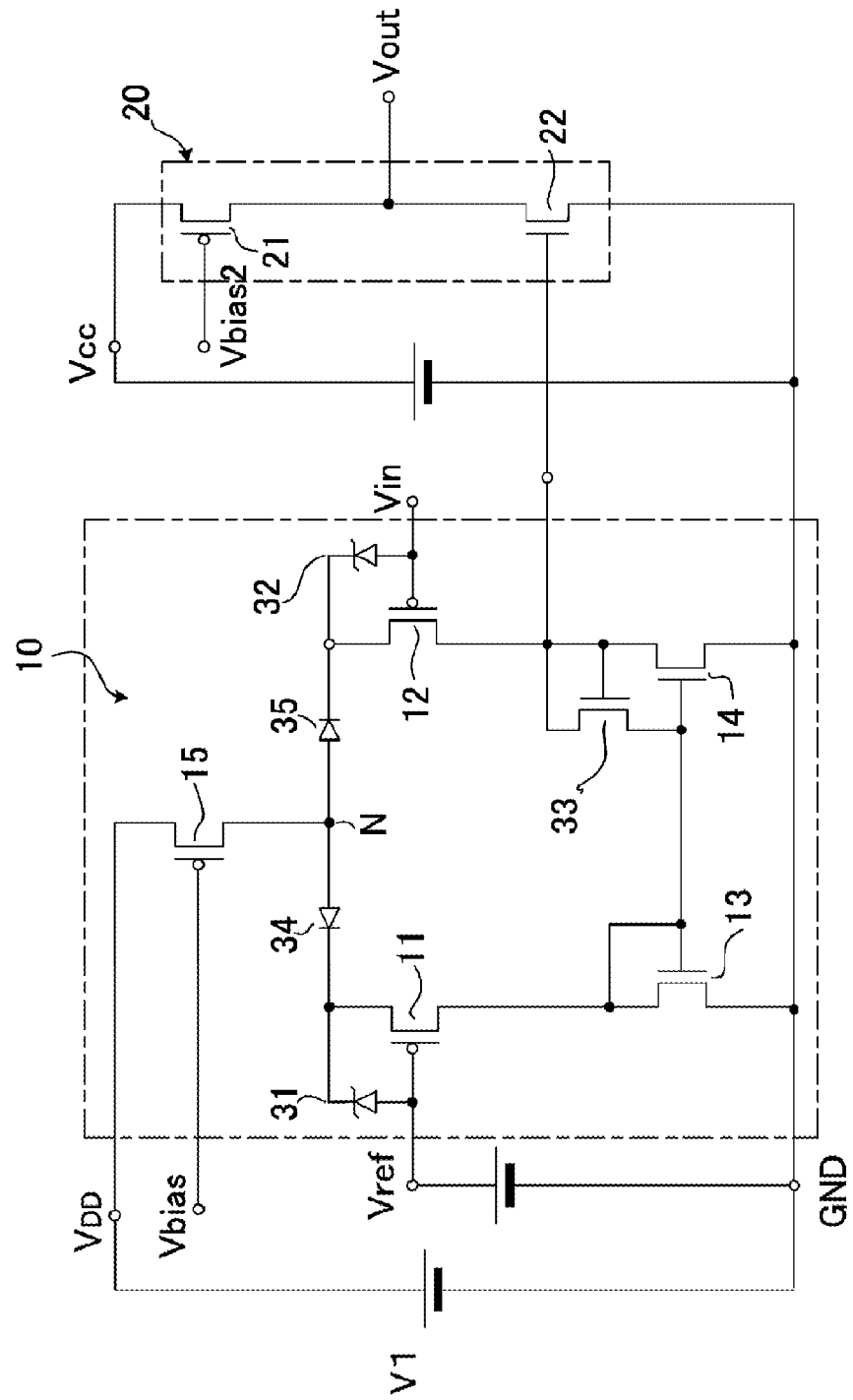
FIG. 5 shows a schematic construction of a comparator according to a third embodiment of the present invention.

A comparator can still further have a construction as shown in FIG. 5, which illustrates an embodiment of the third aspect of the present invention. This comparator is characterized by providing, in addition to the Zener diodes 31 and 32 and the feedback MOSFET 33, rectifying diodes 34 and 35, which are semiconductor rectifying elements, between the constant current source and the source of the input MOSFET 11 and between the constant current source and the source of the input MOSFET 12. The rectifying diodes 34 and 35 have a reverse blocking characteristic of at least the power supply voltage $V_{DD}$.

When the voltage applied to the gate of the input MOSFETs 11 and 12 becomes higher than the voltage at the node N in FIG. 5, which is the current output terminal of the constant current source, the voltage being the drain voltage of the MOSFET 15, the rectifying diodes 34 and 35 separate the input MOSFETs 11 and 12 from the MOSFET 15. Because the input MOSFETs 11 and 12 are separated from the constant current source by the rectifying diodes 34 and 35, the current flowing through the input MOSFETs 11 and 12 is interrupted and the gate oxide film in the input MOSFETs 11 and 12 is protected.

It is supposed here that the reference voltage Vref is set at a high voltage near the power supply voltage $V_{DD}$ and the input voltage Vin is set at a low voltage near the ground potential zero volts. It is also supposed that the values of the ratio L/W of the channel length L to the channel width W are all equal in the input MOSFETs 11 and 12 and the MOSFET 15 of the constant current source. In this situation, the MOSFET 15 is subjected, between the gate and source thereof, to the difference voltage between the power supply voltage $V_{DD}$ and the bias voltage Vbias. As a consequence, the input MOSFET 12 is also subjected, between the gate and source thereof, to the difference voltage between the power supply voltage $V_{DD}$ and the bias voltage Vbias. In this case, the input MOSFET 11 is in an OFF state because Vref=$V_{DD}$. Thus, the input MOSFET 12 carries the entire current from the constant current source MOSFET 15. With the assumption of the same L/W ratio, the gate-source voltage Vgs of the input MOSFET 12 is equal to the gate-source voltage Vgs of the MOSFET 15, the latter voltage Vgs being $V_{DD}$–Vbias.

In this circuit, the drain voltage Vd of the MOSFET 15 is represented by the equation Vd=Vin+Vgs+Vf, in which Vgs is the gate-source voltage of the input MOSFET 12 and Vf is the forward voltage drop of the rectifying diode 35.

It is supposed here that the input voltage Vin is zero volts and the gate-source voltage Vgs of the input MOSFET 12 is equal to the bias voltage Vbias applied to the gate of the MOSFET 15. As described above, the input MOSFET 12 is subjected, between the gate and source thereof, to the gate-source voltage of the MOSFET 15, which is the difference voltage between the power supply voltage $V_{DD}$ and the bias voltage Vbias. Thus, the drain voltage Vd is represented by the equation Vd≈$V_{DD}$–Vbias+Vf.

If the rectifying diode 34 is not provided, since the gate voltage of the input MOSFET 11 is near the power supply voltage $V_{DD}$, when the power supply voltage $V_{DD}$ is high and the difference between the bias voltage Vbias and the input voltage Vin is large, the input MOSFET 11 is subjected, between the gate and source thereof, directly to the bias voltage Vbias near the power supply voltage $V_{DD}$. As a consequence, the gate oxide film of the input MOSFET 11 could break down due to the bias voltage Vbias.

In contrast, the rectifying diode 34 provided in the embodiment of FIG. 5 separates the input MOSFET 11 from the MOSFET 15, which is a constant current source, when the gate voltage of the input MOSFET 11 becomes higher than the bias voltage Vbias. In other words the rectifying diodes 34 and 35 perform a function, in the case the gate voltage of the input MOSFET 11 or 12 becomes higher than the bias voltage Vbias, to separate the input MOSFET 11 or 12 that undergoes a high gate voltage from the constant current source.

As a result, the constant current source supplies current solely to the input MOSFET 11 or 12 that is in an ON state. The electric potential at the node N varies according to the gate voltage, which is the reference voltage Vref or the input voltage Vin, of the input MOSFET 11 or 12 that is in an ON state. As a consequence, the gate-source voltage Vgs of the input MOSFET 11 or 12 that is in an ON state is held at an approximately constant level. Therefore, the gate oxide film of the input MOSFETs 11 and 12 is prevented from breakdown even in the case the gate voltage, which is the reference voltage Vref or the input voltage Vin, of the input MOSFET 11 or 12 is at a high level.

When the ratio L/W of the channel length L to the channel width W is different among the MOSFETs 11, 12, and 15, the bias voltage Vbias does not directly appear at the node N. In that case too, when the gate voltage of the input MOSFET 11 or 12 becomes higher than the voltage at the node N, the rectifying diode 34 or 35 separates the input MOSFET 11 or 12 from the constant current source. Therefore, the gate oxide film of the input MOSFET 11 or 12 is prevented from breakdown.

Figure 6:
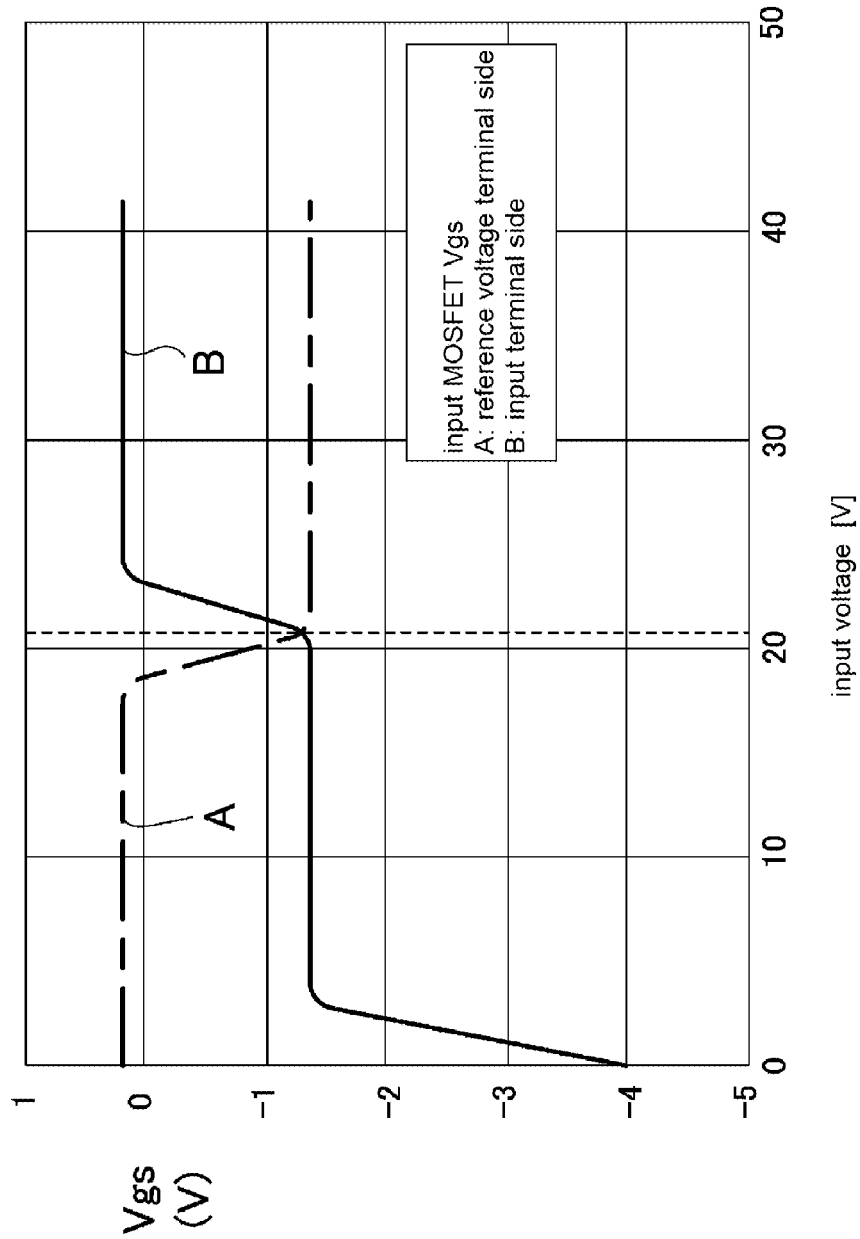
FIG. 6 shows variation of the gate-source voltage Vgs depending on the input voltage Vin to the pair of input MOSFETs in the comparator of FIG. 5.

FIG. 6 shows a simulation results for the gate-source voltage Vgs of the input MOSFETs 11 and 12 in a comparator provided with the rectifying diodes 34 and 35. The rectifying diodes 34 and 35 selectively separate the input MOSFET 11 or 12 with a high gate voltage from the constant current source, which is the MOSFET 15. As a result, the gate-source voltage Vgs of the input MOSFET 11 or 12 that is in an ON state is held at an approximately constant value as shown in FIG. 6. Therefore, the gate-source voltage Vgs of the input MOSFETs 11 and 12 is restricted to a sufficiently low value.

In the comparator having the construction described above, under the function of restricting the gate-source voltage Vgs owing to the Zener diodes 31 and 32 and the feedback MOSFET 33, electric current supply itself to the input MOSFET 11 or 12 is selectively interrupted using the rectifying diodes 34 and 35. Thus, the gate-source voltage Vgs of the input MOSFETs 11 and 12 is restricted to a voltage below the withstand voltage of the input MOSFETs 11 and 12, for example to 4 V. Therefore, the comparator shown in FIG. 5, as compared with the comparators shown in FIG. 1 and FIG. 3, better assures avoiding breakdown of the gate oxide film of the input MOSFETs 11 and 12 with more effectiveness.

Figure 7:
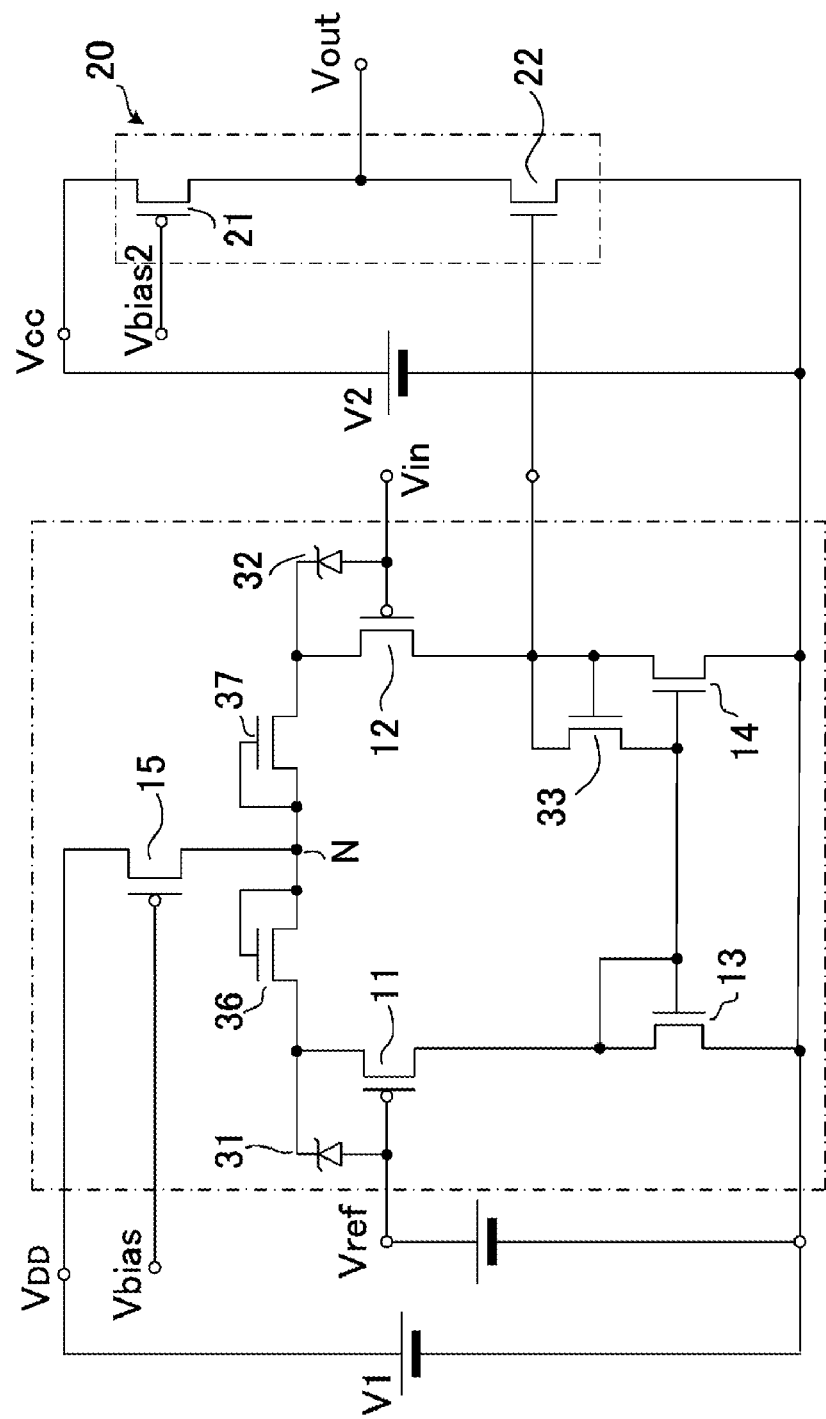
FIG. 7 shows a schematic construction of a comparator according to a fourth embodiment of the present invention.

The rectifying diodes 34 and 35 can be replaced as shown in FIG. 7 by MOSFETs 36 and 37 in the diode connection, which are semiconductor rectifying elements, interposed between the constant current source and the input MOSFET 11 and between the constant current source and the input MOSFET 12. This construction also has the same advantages as the construction provided with the rectifying diodes 34 and 35 and protects the gate oxide film of the input MOSFETs 11 and 12 as well.

As described thus far, while taking basic advantage of the main body comparator 10 having a CMOS structure, a comparator of the present invention restricts the gate-source voltage Vgs of the input MOSFETs 11 and 12 to be within the withstand voltage of the MOSFETs; the MOSFETs 11 and 12 compose a differential input section for the input voltage Vin and a reference voltage Vref. In order to achieve the restriction of the gate-source voltage Vgs of the input MOSFETs 11 and 12 to be within the withstand voltage of the MOSFETs, a basic construction provides the Zener diodes 31 and 32 between the gate and source of the input MOSFETs 11 and 12 in parallel in the forward direction.

Another comparator of the invention comprises a feedback MOSFET 33 to feedback-control the drain voltage of the input MOSFET 12 and restrains amplitude of the drain voltage, which is an output voltage. Thus, the gate-source voltage Vgs of the input MOSFET 12 is restricted together with the effect of the Zener diode 32. At the same time, the negative feedback control on the drain voltage also restricts the gate-source voltage Vgs of the MOSFET 22 in the inverter circuit 20 to be within the withstand voltage thereof. Still another comparator of the invention comprises the rectifying diodes 34 and 35, or the MOSFETs 36 and 37 in diode connection. These semiconductor elements separates the input MOSFET 11 or 12 that is subjected to a high gate voltage, and protect the gate oxide film thereof from breakdown.

Therefore, a comparator of the present invention prevents the input MOSFETs 11 and 12 from breakdown reliably and effectively with a simple construction. Even in the case the input voltage Vin is a high voltage approximately equal to the power supply voltage $V_{DD}$, or in the case the reference voltage Vref is set at a low voltage near the ground potential, direct comparison is possible between the input voltage Vin and the reference voltage Vref. A comparator constructed using a MOSFET with a thin gate oxide film does not have disadvantages of conventional comparators.

The present invention is not limited to the embodiments described above. The MOSFET in the above description has a gate oxide film with a thickness of 25 nm and with a withstand voltage of 7 V. The present invention can be of course applied to other MOSFETs with a different thickness and specifications including a withstand voltage. The Zener diodes 31 and 32 in this case can be selected to exhibit a breakdown voltage according to the withstand voltage of the MOSFET that is determined depending on the thickness of the gate oxide film of the MOSFET. The reverse blocking voltage of the semiconductor rectifying elements, specifically the rectifying diodes 34 and 35 and the MOSFETs 36 and 37 in diode connection, can be sufficiently determined at a voltage higher than the power supply voltage $V_{DD}$.

The input voltage Vin and the reference voltage Vref can be exchanged in applying to the gate of the input MOSFETs 11 and 12 in a comparator of the invention. A comparator of the invention does not necessarily include the inverter circuit 20 and can be installed in various control ICs. The present invention can be modified to various forms without departing from the spirit and scope of the invention.

DESCRIPTION OF SYMBOLS

10: main body comparator
11, 12: input MOSFET
13, 14: load MOSFET
15: MOSFET of a constant current source
20: inverter circuit
21, 22: MOSFET of an inverter circuit
31, 32: Zener diode
33: feedback MOSFET
34, 35: rectifying diode
36, 37: MOSFET in diode connection

What is claimed is:

1. A comparator comprising:
    a main body comparator of a differential amplifier type including:
        a pair of input MOSFETs in a differential pair receiving a reference voltage and an input voltage at a respective gate of the input MOSFETs; and
        a pair of load MOSFETs having gates thereof connected to each other and drains thereof connected to respective drain of the input MOSFETs; and
        a constant current source to supply a constant current to sources of the input MOSFETs; and
    Zener diodes exhibiting a breakdown voltage lower than a withstand voltage of a gate oxide film of the input MOSFETs and connected between a gate and a source of each of the input MOSFETs in parallel in a forward direction.

2. The comparator according to claim 1, wherein the input MOSFETs are p channel type MOSFETs and the load MOSFETs are n channel type MOSFETs.

3. The comparator according to claim 1 further comprising an inverter circuit with a CMOS structure that inverts the output voltage of the main body comparator and outputs an inverter voltage externally.

4. The comparator according to claim 3, wherein the inverter circuit is driven by a power supply voltage different from a power supply voltage for the main body comparator.

5. A comparator comprising:
    a main body comparator of a differential amplifier type including:
        a pair of input MOSFETs in a differential pair receiving a reference voltage and an input voltage at a respective gate of the input MOSFETs; and
        a pair of load MOSFETs having gates thereof connected to each other and drains thereof connected to respective drains of the input MOSFETs; and
        a constant current source to supply a constant current to sources of the input MOSFETs; and
    Zener diodes exhibiting a breakdown voltage lower than a withstand voltage of a gate oxide film of the input MOSFETs and connected between a gate and a source of each of the input MOSFETs in parallel in a forward direction; and
    a feedback MOSFET that performs negative feedback of an output voltage of the main body comparator to gates of the load MOSFETs to restrict an amplitude of the output voltage of the main body comparator.

6. The comparator according to claim 5, wherein the feedback MOSFET has a drain and a gate thereof connected to the drain of one of the input MOSFETs, and a source of the feedback MOSFET connected to the gates of the load MOSFETs.

7. The comparator according to claim 5, wherein the input MOSFETs are p channel type MOSFETs and the load MOSFETs are n channel type MOSFETs.

8. The comparator according to claim 5 further comprising an inverter circuit with a CMOS structure that inverts the output voltage of the main body comparator and outputs an inverter voltage externally.

9. A comparator comprising:
    a main body comparator of a differential amplifier type including:
        a pair of input MOSFETs in a differential pair receiving a reference voltage and an input voltage at a respective gate of the input MOSFETs; and
        a pair of load MOSFETs having gates thereof connected to each other and drains thereof connected to respective drain of the input MOSFETs; and
        a constant current source to supply a constant current to sources of the input MOSFETs; and
    Zener diodes exhibiting a breakdown voltage lower than a withstand voltage of a gate oxide film of the input MOS- FETs and connected between a gate and a source of each of the input MOSFETs in parallel in a forward direction; and a feedback MOSFET that performs negative feedback of an output voltage of the main body comparator to gates of the load MOSFETs to restrict an amplitude of the output voltage of the main body comparator; and semiconductor rectifying elements that exhibit a reverse blocking characteristic higher than a power supply voltage and are interposed between the constant current source and a source of each input MOSFET.

10. The comparator according to claim 9, wherein the semiconductor rectifying element is a rectifying diode or a MOSFET in diode connection.

11. The comparator according to claim 9 wherein the input MOSFETs are p channel type MOSFETs and the load MOSFETs are n channel type MOSFETs.

12. The comparator according to claim 9, wherein the feedback MOSFET has a drain and a gate thereof connected to the drain of one of the input MOSFETs, and a source of the feedback MOSFET connected to the gates of the load MOSFETs.

13. The comparator according to claim 9 further comprising an inverter circuit with a CMOS structure that inverts the output voltage of the main body comparator and outputs an inverter voltage externally.

14. An apparatus, comprising:
a comparator configured to compare an input voltage to a reference voltage and output a resulting output voltage;
a first logic device having a withstand voltage and coupled to an input terminal to be connected to the input voltage;
a second logic device having a withstand voltage and coupled to a terminal of the reference voltage;
a first circuit element having a breakdown voltage and connected to the input terminal and to a terminal of the first logic device; and
a second circuit element having a breakdown voltage and connected to the terminal of the reference voltage and to a terminal of the second logic device;
wherein the breakdown voltage of each of the first circuit element and the second circuit element is lower than the withstand voltage of each of the first logic device and the second logic device.

15. The apparatus of claim 14, further comprising a voltage limiting device coupled to the first logic device and configured to limit a voltage applied to the first logic device to the withstand voltage of the first logic device.

16. The apparatus of claim 14, further comprising a first rectifying element coupled to the first circuit element and the terminal of the first logic device, and a second rectifying element coupled to the second circuit element and the terminal of the second logic device.

17. The apparatus of claim 14, wherein the first logic device and the second logic device each includes a gate oxide film and the withstand voltage of each of the first logic device and the second logic device corresponds to its gate oxide film.

18. The apparatus of claim 17, wherein each of the first logic device and second logic device includes a MOSFET.

* * * * *